(12) United States Patent
Sekine et al.

(10) Patent No.: US 7,501,335 B2
(45) Date of Patent: Mar. 10, 2009

(54) SEMICONDUCTOR DEVICE AND MANUFACTURING METHOD OF THE SAME

(75) Inventors: Katsuyuki Sekine, Kanagawa (JP); Yoshitaka Tsunashima, Kanagawa (JP); Seiji Inumiya, Kanagawa (JP); Akio Kaneko, Kanagawa (JP); Motoyuki Sato, Kanagawa (JP); Kazuhiro Eguchi, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 450 days.

(21) Appl. No.: 10/999,937

(22) Filed: Dec. 1, 2004

(65) Prior Publication Data

US 2005/0170666 A1  Aug. 4, 2005

(30) Foreign Application Priority Data

Dec. 2, 2003  (JP) .............................. 2003-403283

(51) Int. Cl.
*H01L 21/336* (2006.01)
*H01L 29/78* (2006.01)
*H01L 21/469* (2006.01)

(52) U.S. Cl. .................. 438/591; 438/287; 438/785; 438/786

(58) Field of Classification Search ................ 438/287, 438/591, 785, 786
See application file for complete search history.

(56) References Cited

U.S. PATENT DOCUMENTS

| 6,825,538 | B2 * | 11/2004 | Frank et al. ................. 257/411 |
| 6,949,433 | B1 * | 9/2005 | Hidehiko et al. ............ 438/261 |
| 2002/0072187 | A1 * | 6/2002 | Chetlur et al. .............. 438/359 |
| 2004/0235254 | A1 | 11/2004 | Inumiya et al. |
| 2005/0158932 | A1 * | 7/2005 | Inumiya et al. ............. 438/197 |

FOREIGN PATENT DOCUMENTS

| JP | 10-303424 | 11/1998 |
| JP | 11-274489 | 10/1999 |
| JP | 2000-049349 | 2/2000 |
| JP | 2000-58832 | 2/2000 |
| JP | 2002-299612 | 10/2002 |
| JP | 2005-175424 | 6/2005 |

OTHER PUBLICATIONS

Notification of Reason for Rejection issued by the Japanese Patent Office on Feb. 6, 2007, for Japanese Patent Application No. 2003-403283, and English-language translation thereof.

* cited by examiner

*Primary Examiner*—Zandra Smith
*Assistant Examiner*—Pamela E Perkins
(74) *Attorney, Agent, or Firm*—Finnegan, Henderson, Farabow, Garrett & Dunner, L.L.P.

(57) ABSTRACT

A manufacturing method of a semiconductor device disclosed herein, comprises: forming a silicate film containing metal on a substrate; and introducing nitrogen and deuterium into the silicate film by using $ND_3$ gas.

11 Claims, 11 Drawing Sheets

RELATED EXAMPLE

SEMICONDUCTOR DEVICE AND
MANUFACTURING METHOD OF THE SAME

CROSS REFERENCE TO RELATED
APPLICATION

This application claims benefit of priority under 35 U.S.C.§119 to Japanese Patent Application No. 2003-403283, filed on Dec. 2, 2003, the entire contents of which are incorporated by reference herein.

BACKGROUND OF THE INVENTION

1. Field of the Invention

The present invention relates to a semiconductor device and a manufacturing method of the same, and particularly relates to a semiconductor device having a silicate film as an insulating film and a manufacturing method of the semiconductor device having the insulating film.

2. Related Background Art

A method of forming an insulating film with silicate is disclosed in Japanese Patent Application Laid-open No. 2000-49349 (hereinafter referred to as Patent Document 1). FIG. 1 and FIG. 2 are diagrams for explaining a process for forming the insulating film with silicate which is disclosed in Patent Document 1. As shown in FIG. 1, in Patent Document 1, there is disclosed a method in which after a silicate film is formed, the silicate film is subjected to deposition using a nitrogen source such as distant nitrogen plasma, NO, $N_2O$, or $NH_3$, and by this nitridation, nitrogen is supplied to silicate. Alternatively, as shown in FIG. 2, there is disclosed a method in which after a silicate film is formed, the silicate film is subjected to heat treatment and then nitriding treatment using $NH_3$ or the like.

However, from a study of the present inventor, it turns out that when a necessary amount of nitrogen to prevent a layer from being isolated and crystallized is introduced into the silicate film, nitridation using $NH_3$ is very effective. Moreover, it turns out that unlike when $SiO_2$ is nitrided with $NH_3$, when the silicate film is nitrided with $NH_3$, nitrogen is introduced into the whole silicate film.

However, when nitridation using $NH_3$ is adopted, the silicate film containing metal cannot be subjected to high-temperature and long-time heat treatment in terms of oxidation resistance and heat resistance even after nitrogen is introduced. Therefore, unlike when $SiO_2$ is nitrided with $NH_3$, hydrogen contained in the silicate film in the step of nitridation using $NH_3$ cannot be fully eliminated in a subsequent step. Accordingly, as described also in Patent document 1, hydrogen remains in the film after nitridation, which causes a deterioration of reliability.

SUMMARY OF THE INVENTION

In order to accomplish the aforementioned and other objects, according to one aspect of the present invention, a manufacturing method of a semiconductor device, comprises:

forming a silicate film containing metal on a substrate; and introducing nitrogen and deuterium into the silicate film by using $ND_3$ gas.

According to another aspect of the present invention, a manufacturing method of a semiconductor device, comprises:

forming a metal oxide film containing metal on a substrate; and introducing nitrogen and deuterium into the metal oxide film by using $ND_3$ gas.

According to another aspect of the present invention, a semiconductor device, comprises:

a substrate; and a silicate film which is formed on the substrate and contains metal, nitrogen and deuterium being introduced into the silicate film, and the silicate film containing 10% or more nitrogen in elemental composition ratio.

According to another aspect of the present invention, a semiconductor device, comprises:

a substrate; and a metal oxide film which is formed on the substrate and contains metal, nitrogen and deuterium being introduced into the metal oxide film, and the metal oxide film containing 10% or more nitrogen in elemental ratio.

DETAILED DESCRIPTION OF THE EMBODIMENTS

First Embodiment

In the first embodiment, by forming a hafnium silicate film and thereafter introducing N (nitrogen) and D (deuterium) into the hafnium silicate film using $ND_3$, dangling bonds in the hafnium silicate film are terminated by D, and consequently fixed charge density and interface state density in the hafnium silicate film are reduced as compared with nitridation using $NH_3$. This greatly improves current driving capability in a transistor using the hafnium silicate film formed by nitiridation with $ND_3$ as a gate insulating film. Moreover, due to nitridation using $ND_3$, the formation of Hf—N bonds in the hafnium silicate film becomes difficult, and thereby a site which becomes a path of a leakage current is terminated by D, resulting in a reduction in leakage current. Further details will be given below.

Figure 1:
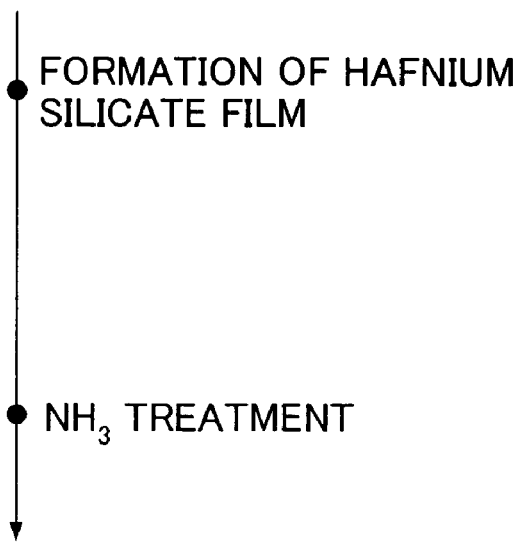
FIG. 1 is a flow diagram for explaining a related manufacturing process for forming an insulating film with a silicate film.
Figure 2:
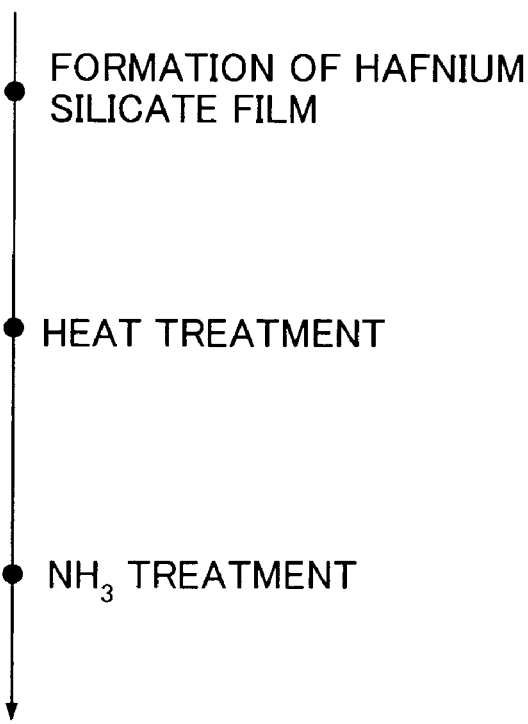
FIG. 2 is a flow diagram for explaining another related manufacturing process for forming an insulating film with a silicate film.
Figure 3:
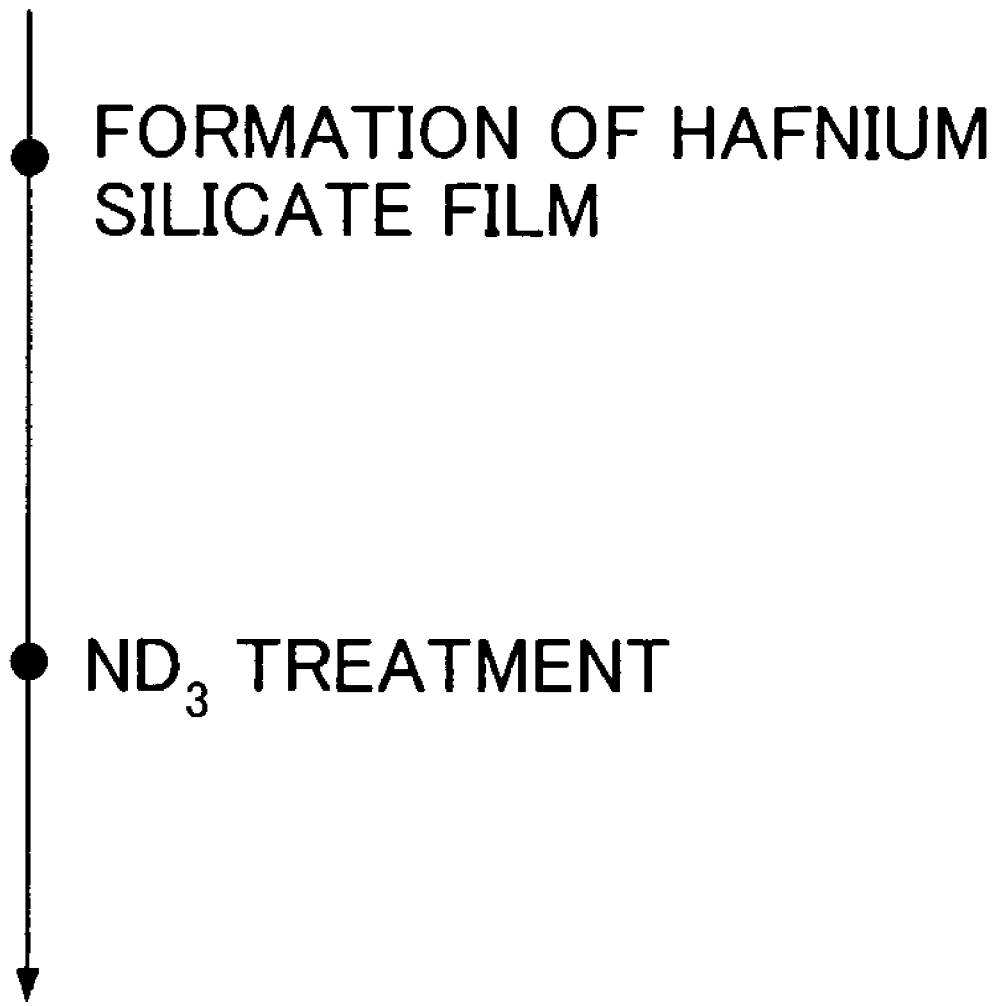
FIG. 3 is a flow diagram for explaining a manufacturing process for forming an insulating film with a silicate film according to a first embodiment.
Figure 4:
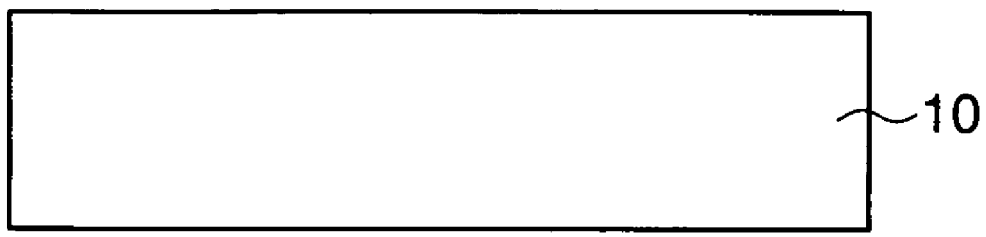
FIG. 4 is a sectional view of a semiconductor device for explaining the manufacturing process for forming the insulating film with the silicate film according to the first embodiment.
Figure 5:
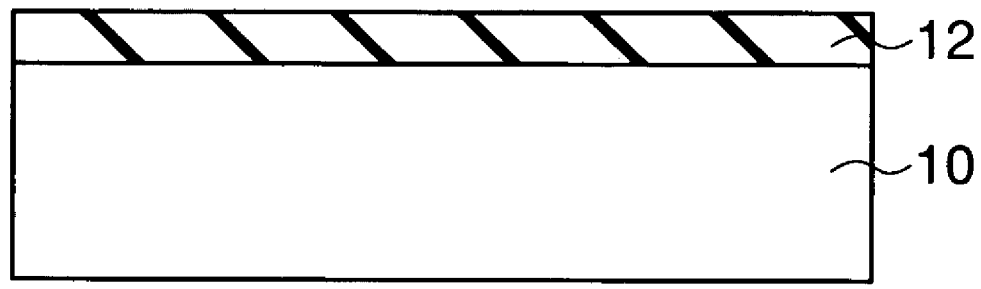
FIG. 5 is a sectional view of the semiconductor device for explaining the manufacturing process for forming the insulating film with the silicate film according to the first embodiment.

FIG. 3 is a diagram for explaining a method of forming an insulating film of a semiconductor device according to this embodiment, and FIG. 4 and FIG. 5 are diagrams each showing a section of the semiconductor device for explaining a process for forming the insulating film of the semiconductor device according to this embodiment.

As can be seen from FIG. 3 and FIG. 4, a silicon substrate 10 is cleaned with dilute hydrofluoric acid to remove a natural oxide film formed on the silicon substrate 10. Incidentally, the silicon substrate 10 is an example of a substrate used in this embodiment.

Then, as shown in FIG. 5, a hafnium silicate (Hf silicate) film 12 is formed on the silicon substrate 10 by an MOCVD method. Subsequently, this semiconductor substrate is placed in a reaction chamber, heated, for example, to 800° C., and nitrided with 100% $ND_3$ at 760 Torr.

According to an experimental result, when compared to the related nitridation using $NH_3$, the concentration of nitrogen introduced into the Hf silicate film 12 with respect to nitridation time is almost the same in both of nitridation using $NH_3$ and nitridation using $ND_3$.

Figure 6:
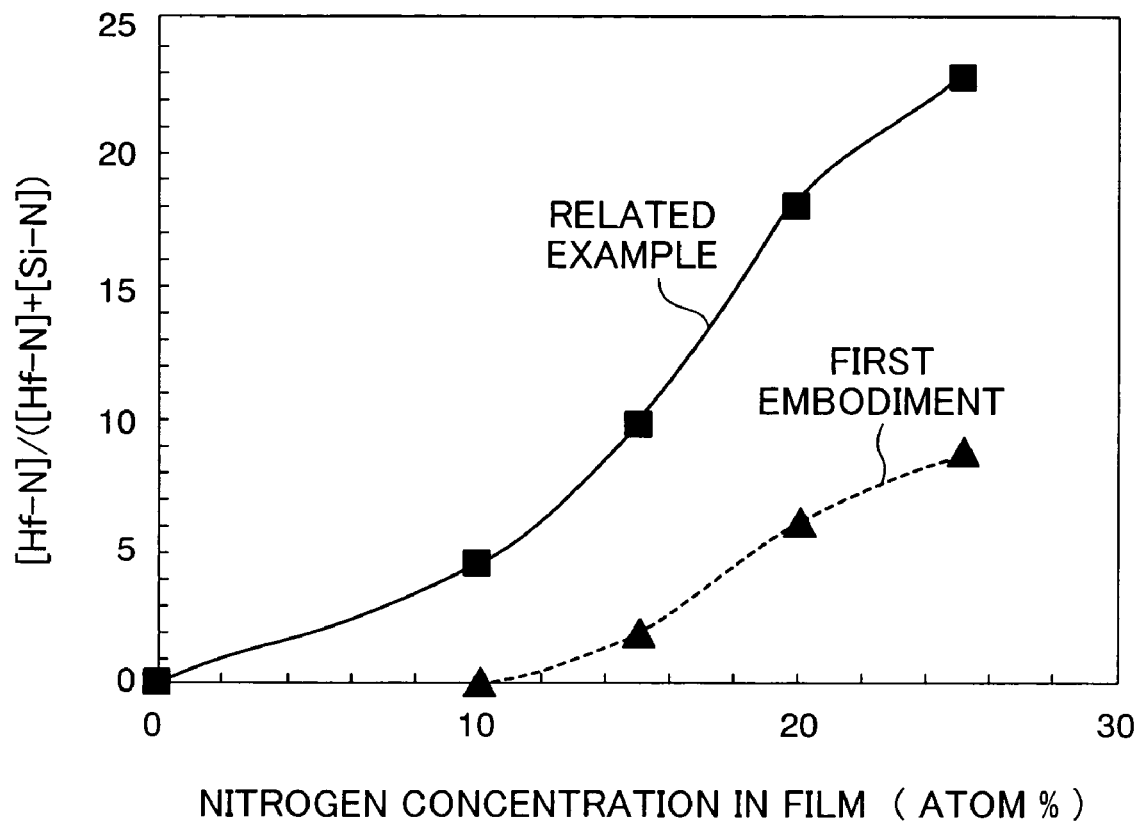
FIG. 6 is a graph showing the ratios of Si—N bonds to Hf—N bonds in the silicate film of the first embodiment and the related silicate film.

FIG. 6 is a graph showing the ratios of Si—N bonds to Hf—N bonds in the semiconductor device of this embodiment and the related semiconductor device, and this graph is obtained by analyzing the state of bonds in the Hf silicate film 12 by an X-ray photoelectron spectrometer. The horizontal axis of this graph represents the nitrogen concentration in the Hf silicate film 12.

In both cases, Si—N bonds are identified in the Hf silicate film 12, but in the case of nidridation using $ND_3$, the proportion of Hf—N bonds in the Hf silicate film 12 is obviously low. The Hf—N bond has conductivity, which means that as the number of Hf—N bonds reduces, the leakage current flowing through the Hf silicate film 12 reduces.

Figure 7:
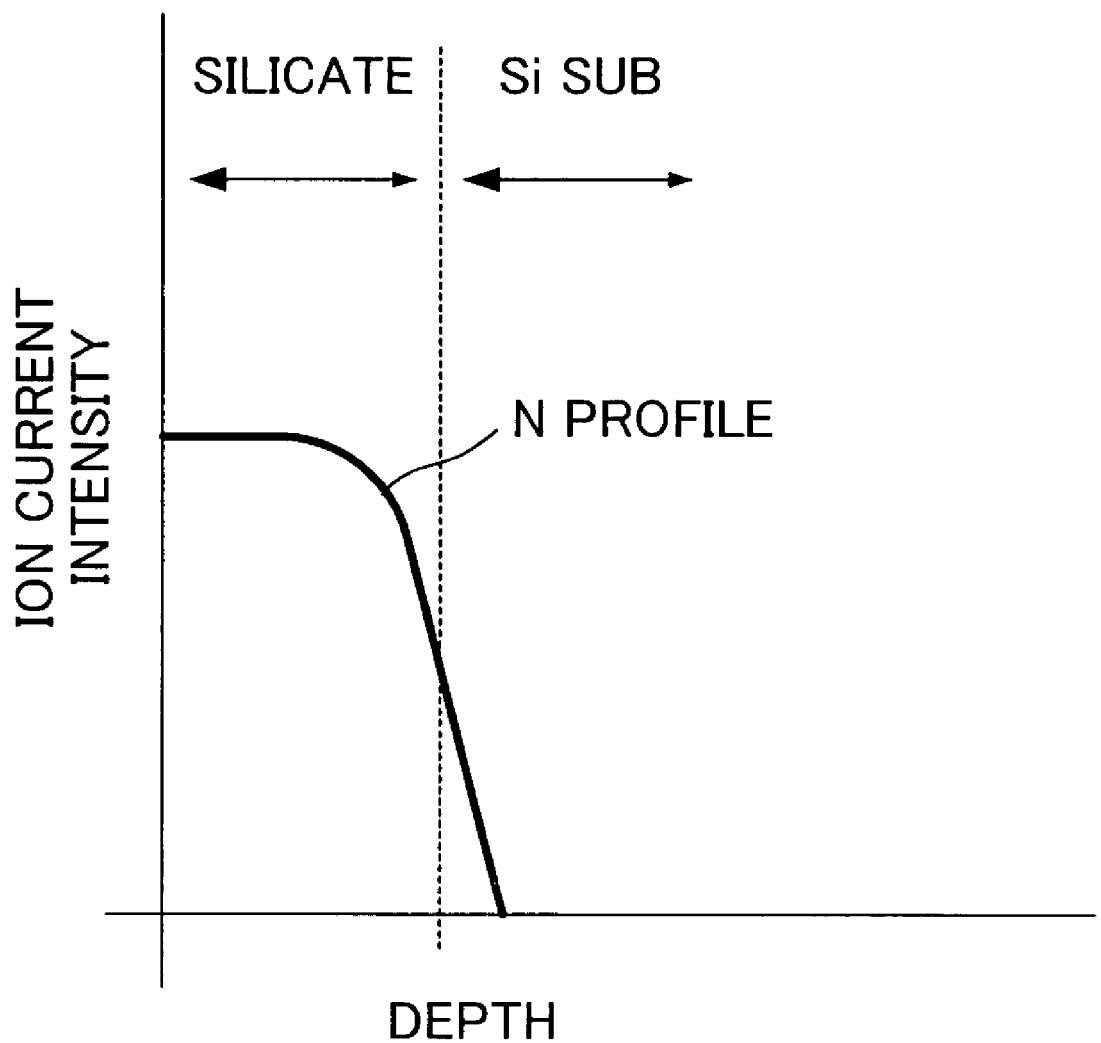
FIG. 7 is a graph showing N and D profiles in the related silicate film.
Figure 8:
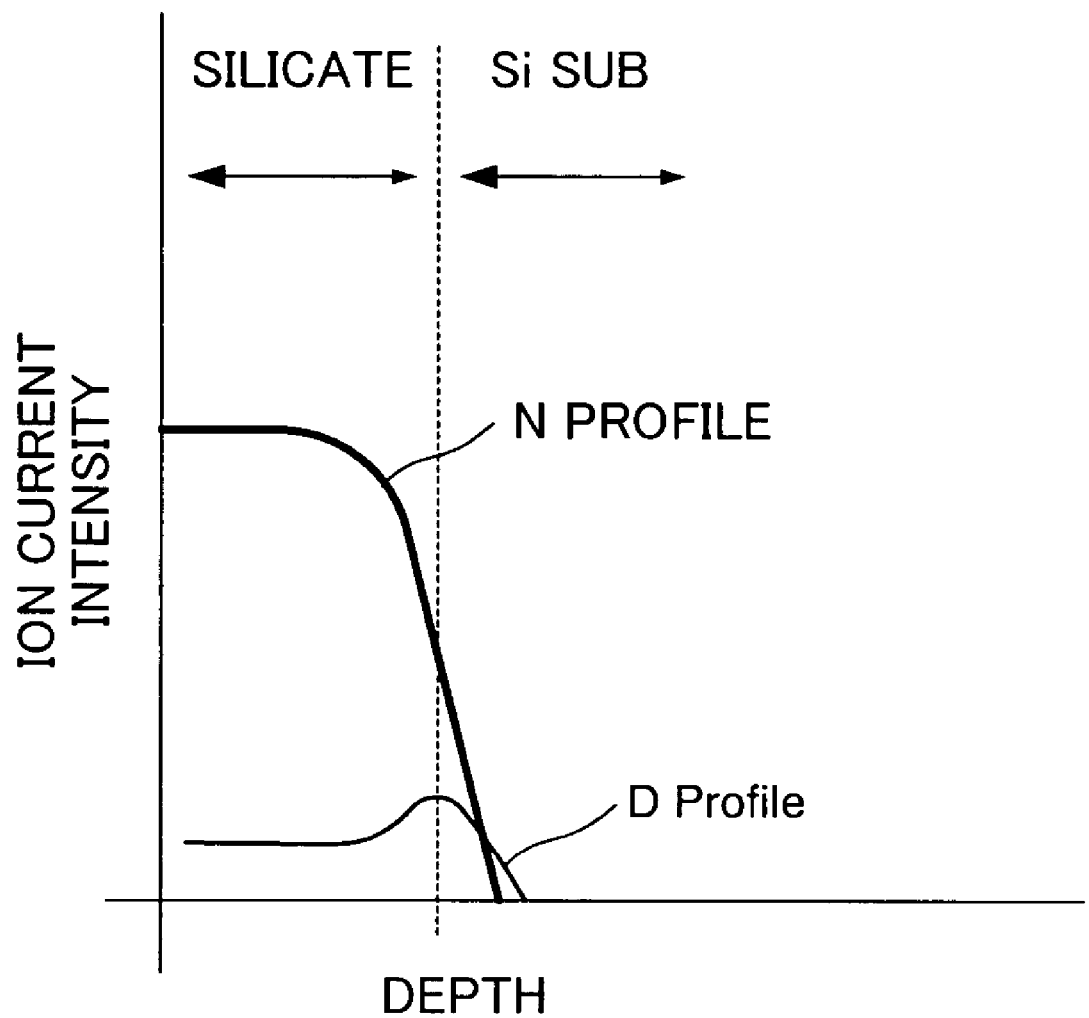
FIG. 8 is a graph showing N and D profiles in the silicate film of the first embodiment.

FIG. 7 and FIG. 8 show investigation results of in-depth profiles of N and D in the Hf silicate film 12 in the cases of nitridation using $NH_3$ and nitridation using $ND_3$. FIG. 7 shows the related profiles, and FIG. 8 shows the profiles of this embodiment. In each figure, the horizontal axis represents depth, and the vertical axis represents ion current intensity.

As can be seen from FIG. 7 and FIG. 8, in both cases of nitridation using $NH_3$ and nitridation using $ND_3$, nitrogen exists almost uniformly in the Hf silicate film 12, and in the case of nitridation using $ND_3$, D exists in the Hf silicate film 12. Note that whichever gas is used for nitridation, in order to provide sufficient heat resistance to the Hf silicate film 12, it is preferable to introduce 10% or more nitrogen in elemental composition ratio. For example, this concentration can be measured by the photoelectron spectroscopy.

Figure 9:
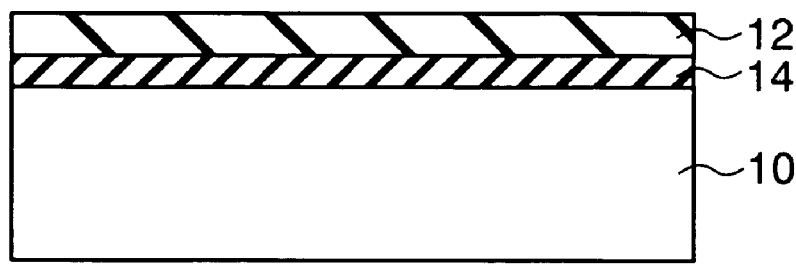
FIG. 9 is a sectional view of a semiconductor device for explaining a modification of the first embodiment.

Incidentally, in this embodiment, the case where the Hf silicate film 12 is formed directly on the silicon substrate 10 is explained, but as shown in FIG. 9, an insulating film 14 such as a silicon oxide film or a silicon oxynitride film may be intentionally formed on the silicon substrate 10. Then, the same effect can be obtained also by forming the Hf silicate film 12 on the insulating film 14.

Moreover, in this embodiment, the case where the Hf silicate film 12 is deposited by the MOCVD method is explained, but the Hf silicate film 12 may be formed by an ALD method or a sputtering method.

Figure 10:
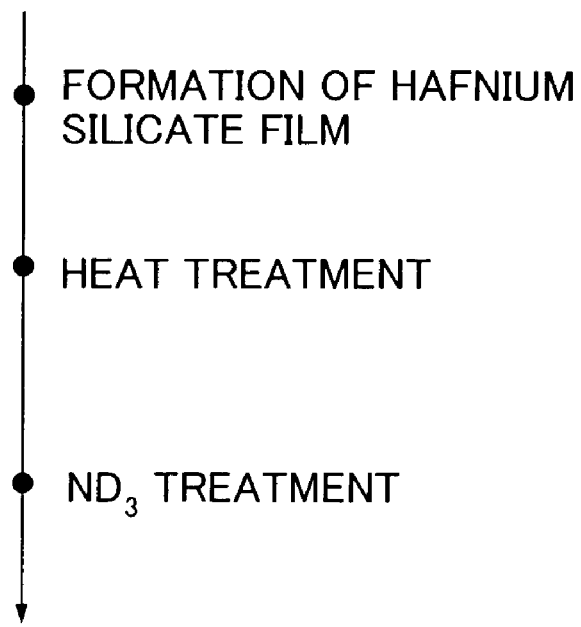
FIG. 10 is a flow diagram of a manufacturing process for explaining another modification of the first embodiment.

Further, in this embodiment, the case where the Hf silicate film 12 is subjected to $ND_3$ treatment immediately after being deposited, but as shown in FIG. 10, after being formed, the Hf silicate film 12 may be subjected to heat treatment in an inert atmosphere or a dilute oxygen atmosphere, and then subjected to $ND_3$ treatment.

Furthermore, in this embodiment, the example of nitridation of the Hf silicate film 12 is shown, but a silicate film containing a metallic element such as zirconium other than hafnium may be used instead.

Second Embodiment

In the aforementioned first embodiment, heat treatment is used when the Hf silicate film is nitrided with $ND_3$ gas, but the Hf silicate film can also be nitrided by exciting plasma.

Figure 11:
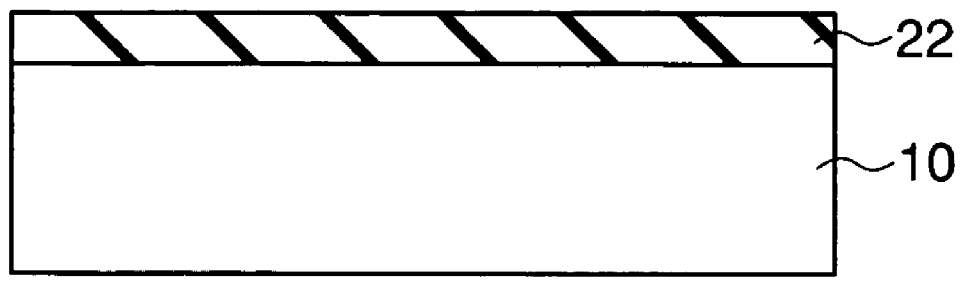
FIG. 11 is a sectional view of a semiconductor device for explaining a manufacturing process for forming an insulating film with a silicate film according to a second embodiment.

FIG. 11 is a sectional view for explaining a process for forming an insulating film of a semiconductor device according to this embodiment. As shown in FIG. 11, after the silicon substrate 10 is cleaned with dilute hydrofluoric acid to remove a natural oxide film, a Hf silicate film 22 is formed on the silicon substrate 10 by MOCVD. Subsequently, this semiconductor substrate is placed in a reaction chamber and heated from ambient temperature to approximately 400° C. in an atmosphere containing $ND_3$ between 10 mTorr and 1 Torr, and plasma is generated by applying a microwave of 2.45 GHz, whereby the surface of the semiconductor substrate is exposed to the plasma to nitride the Hf silicate film 22.

Also in this case, similarly to the first embodiment, it is confirmed that when the $ND_3$ gas is used, fewer Hf—N bonds exist in the Hf silicate film 22. Moreover, in-depth profiles of N and D are almost the same as those in the first embodiment in which thermal nitridation is performed.

In this embodiment, nitridation is performed by directly exposing the semiconductor substrate to plasma, but if remote plasma in which the semiconductor substrate is not directly exposed to plasma is used, plasma damage can be reduced. Moreover, in this embodiment, the case where the Hf silicate film 22 is deposited by the MOCVD method is explained, but the same effect can be obtained also by forming this Hf silicate film 22 by an ALD method or a sputtering method.

Further, in this embodiment, the case where the Hf silicate film 22 is subjected to ND$_3$ treatment immediately after being deposited is explained, but as shown in FIG. 10, after being formed, the Hf silicate film 12 may be subjected to heat treatment in an inert atmosphere or a dilute oxygen atmosphere, and then subjected to ND$_3$ treatment.

Furthermore, in this embodiment, the example of nitridation of the Hf silicate film 22 is shown, but a silicate film containing a metallic element such as zirconium other than hafnium may be used instead.

Third Embodiment

Figure 12:
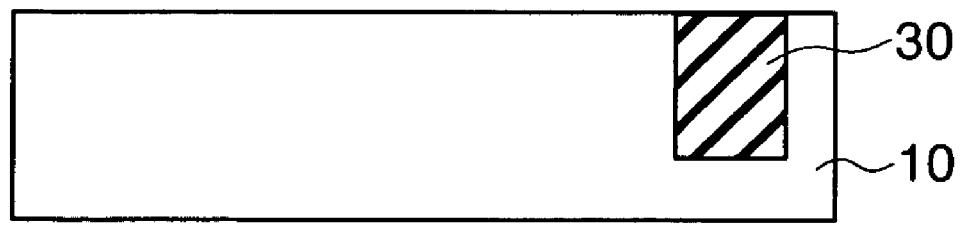
FIG. 12 is a sectional view of a semiconductor device for explaining a manufacturing process for forming an insulating film with a silicate film according to a third embodiment.
Figure 13:
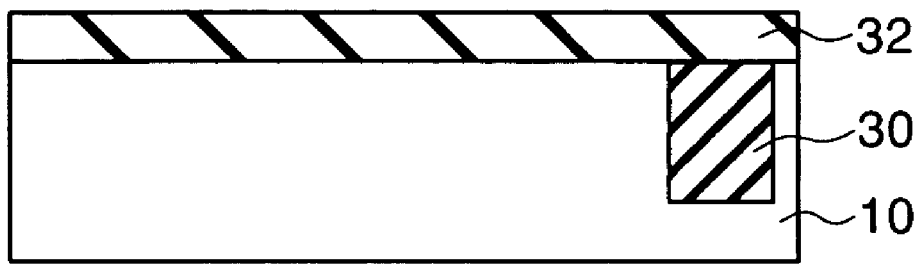
FIG. 13 is a sectional view of the semiconductor device for explaining the manufacturing process for forming the insulating film with the silicate film according to the third embodiment.
Figure 14:
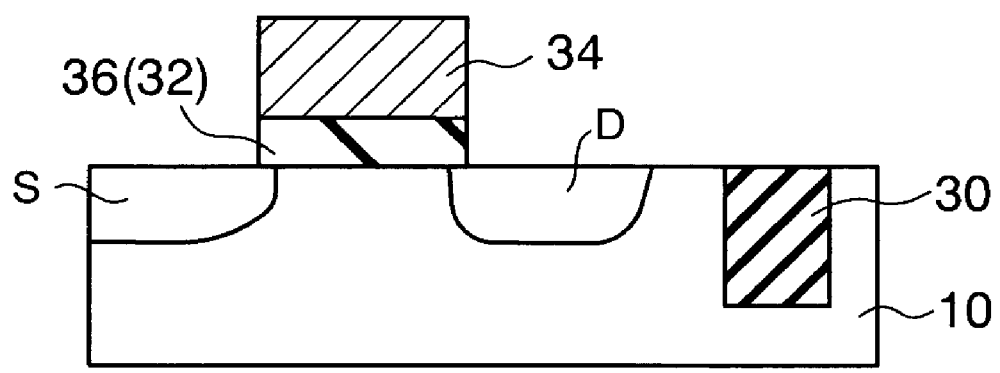
FIG. 14 is a sectional view of the semiconductor device for explaining the manufacturing process for forming the insulating film with the silicate film according to the third embodiment.

FIG. 12 to FIG. 14 are sectional views for explaining a process for forming an insulating film of a semiconductor device according to this embodiment.

In this embodiment, as shown in FIG. 12, an element isolation region is formed in the silicon substrate 10 using a shallow trench isolation 30. Subsequently, this semiconductor substrate is cleaned with dilute hydrofluoric acid to remove a natural oxide film.

Then, as shown in FIG. 13, a Hf silicate film 32 is formed on the silicon substrate 10 by MOCVD. Thereafter, this semiconductor substrate is placed in a reaction chamber, heated to 800° C., and nitrided with 100% ND$_3$ at 760 Torr.

Then, as shown in FIG. 14, a polysilicon layer is formed, and by etching this polysilicon layer and the Hf silicate film 32, a polysilicon electrode (gate electrode) 34 and a gate insulating film 36 are formed. Subsequently, by forming a source region S and a drain region D on both sides of the polysilicon electrode 34 on the surface side of the silicon substrate 10, a MOSFET is obtained. Incidentally, the MOSFET is an example of a transistor in this embodiment.

As a result of calculating Vfb from C-V measurement with respect to the MOSFET thus formed, the Vfb shift is reduced when the Hf silicate film 32 is nitrided with ND$_3$ gas, compared with when it is nitrided with NH$_3$ gas. Moreover, the interface state density measured by a High-Low method is lower in the nitridation using ND$_3$ as compared with the nitridation using NH$_3$. This is because dangling bonds which cause fixed charges are terminated by D.

As a result of evaluating a gate leakage current of this MOSFET, as compared with the nitridation using NH$_3$, in the nitridation using ND$_3$, the gate leakage current is reduced at the same equivalent oxide thickness and the same gate applied voltage. This is because traps which become paths of the gate leakage current are terminated by D and reduced in the Hf silicater film 32. The aforementioned termination of dangling bonds by D and termination of interface state density cannot be found when, like SiO$_2$, the absolute amounts of dangling bonds and interface state density are originally small. One cause of the reduction in leakage current is that the formation of unstable bonds such as Hf—N bonds becomes difficult in the nitridation using ND$_3$.

As a result of evaluating an Ig-Id characteristic, the driving force of the MOSFET is improved in the nidridation using ND$_3$. This is because the interface state density and the fixed charge density in the Hf silicate film 32 are reduced for the aforementioned reason. Such a difference in the driving force of the MOSFET between the nitridation using ND$_3$ and the nitridation using NH$_3$ does not appear in the case of SiON. This phenomenon occurs because by whatever method the silicate film containing metal is formed, many incomplete bonds and dangling bonds exist in the film, and they are terminated by D.

Figure 15:
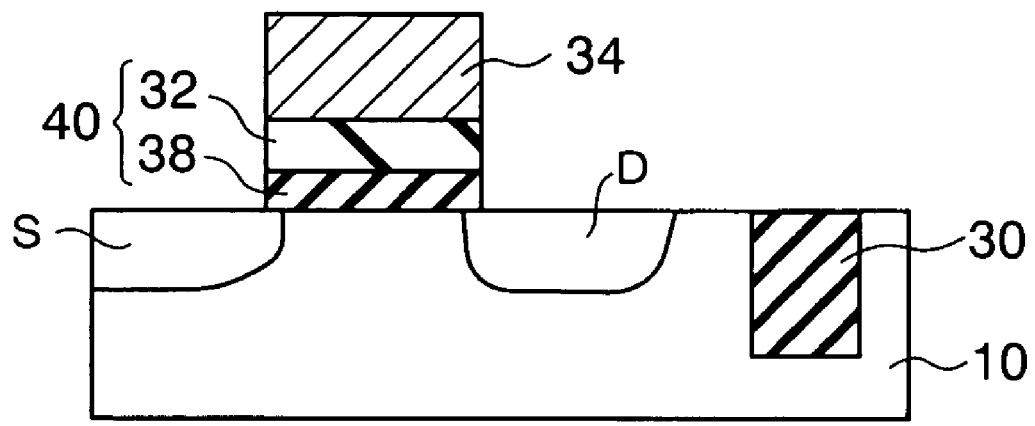
FIG. 15 is a sectional view of a semiconductor device for explaining another manufacturing process for forming an insulating film with a silicate film according to the third embodiment.

In this embodiment, the case where the Hf silicate film 32 is formed directly on the silicon substrate 10 is explained, but as shown in FIG. 15, it is also possible to intentionally form an insulating film 38 such as a silicon oxide film or a silicon oxynitride film on the silicon substrate 10, deposit the Hf silicate film 32 on the insulating film 38, and constitute a gate insulating film 40 by these insulating film 38 and Hf silicate film 32.

Moreover, in this embodiment, the case where the Hf silicate film 32 is deposited by the MOCVD method is explained, but the Hf silicate film 32 may be formed by an ALD method or a sputtering method.

Furthermore, in this embodiment, the example of nitridation of the Hf silicate film 32 is shown, but a silicate film containing a metallic element such as zirconium other than hafnium may be used instead.

As a result of applying a stress at constant electric field to the polysilicon electrode (gate electrode) 34 and evaluating a TDDB characteristic at a substrate temperature of 125° C. with the MOSFET formed in this third embodiment, it is confirmed that as compared with the nitridation using NH$_3$, the intrinsic breakdown lifetime is lengthened in the nitridation using ND$_3$. Moreover, as a result of measuring an NBTI characteristic at a substrate temperature of 90° C., it is confirmed that the Vth shift is reduced in the nitridation using ND3, whereby the NBTI lifetime is improved. At this time, the stress electric field is constant at 5 MV/cm. As just described, a phenomenon in which the reliability of the gate insulating film is improved by making the insulating film contain D, which is confirmed in the case of SiON, is also confirmed in the case of the Hf silicate film 32.

Fourth Embodiment

Figure 16:
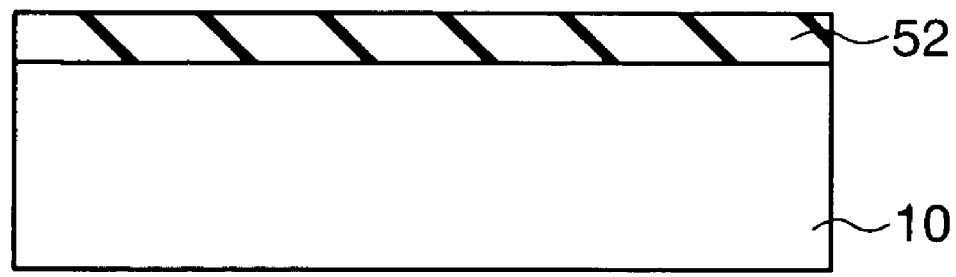
FIG. 16 is a sectional view of a semiconductor device for explaining a manufacturing process for forming an insulating film with a silicate film according to a fourth embodiment.
Figure 17:
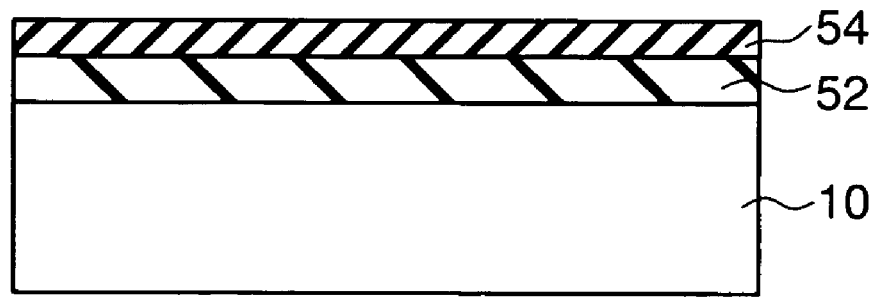
FIG. 17 is a sectional view of the semiconductor device for explaining the manufacturing process for forming the insulating film with the silicate film according to the fourth embodiment.

FIG. 16 and FIG. 17 are sectional views for explaining a process for forming an insulating film of a semiconductor device according to this embodiment.

As shown in FIG. 16, after the silicon substrate 10 is cleaned with dilute hydrofluoric acid to remove a natural oxide film, a Hf silicate film 52 is formed on the silicon substrate 10 by a MOCVD method.

Then, as shown in FIG. 17, a nitride film 54 which is a SiN layer is formed on the Hf silicate film 52 in an atmosphere containing SiD$_4$ and ND$_3$ gas by an LPCVD method. This SiD$_4$ is an example of a silicon source, and some other silicon source such as Si$_2$D$_6$ can also be used. Subsequently, this semiconductor substrate is heat-treated.

By heat-treating the semiconductor substrate, N and D are diffused into not only the nitride film 54 but also the Hf silicate film 52. The introduction of N and D into the Hf silicate film 52 by this method also produces the same effect as when nitridation using ND$_3$ is performed after the Hf silicate film 52 is deposited.

Figure 18:
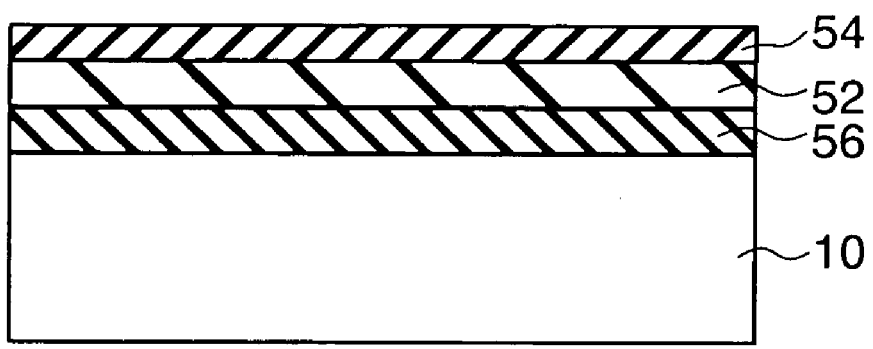
FIG. 18 is a sectional view of a semiconductor device for explaining another manufacturing process for forming an insulating film with a silicate film according to the fourth embodiment.

Incidentally, in this embodiment, the case where the Hf silicate film 52 is formed directly on the silicon substrate 10 is explained, but as shown in FIG. 18, an insulating film 56 such as a silicon oxide film or a silicon oxynitride film may be intentionally formed on the silicon substrate 10. Then, the same effect can be obtained also by forming the Hf silicate film 52 on the insulating film 56.

It should be mentioned that the present invention is not limited to the aforementioned embodiments, and various changes may be made therein. For example, in the aforementioned embodiments, the method of introducing nitrogen and deuterium into the silicate film is disclosed, but the present invention is also applicable to a case where nitrogen and deuterium are introduced into a metal oxide film such an HfO$_2$.

What is claimed is:

1. A manufacturing method of a semiconductor device, comprising:
   forming a silicate film containing metal on a substrate; and
   introducing nitrogen and deuterium into the silicate film by using $ND_3$ gas so that the silicate film contains 10% or more nitrogen in an elemental composition ratio.

2. The manufacturing method of the semiconductor device according to claim 1, further comprising performing heat treatment after the step of forming the silicate film and before the step of introducing the nitrogen and the deuterium into the silicate film.

3. The manufacturing method of the semiconductor device according to claim 1, further comprising:
   forming an additional insulating film on the substrate, wherein the silicate film is formed on the additional insulating film.

4. The manufacturing method of the semiconductor device according to claim 1, wherein in the step of introducing the nitrogen and the deuterium into the silicate film, the silicate film is heat-treated in the $ND_3$ gas.

5. The manufacturing method of the semiconductor device according to claim 1, wherein in the step of introducing the nitrogen and the deuterium into the silicate film, the silicate film is exposed to plasma in the $ND_3$ gas.

6. The manufacturing method of the semiconductor device according to claim 1, further comprising:
   forming a gate electrode on the silicate film, wherein the silicate film is used as a gate insulating film of a transistor.

7. The manufacturing method of the semiconductor device according to claim 3, further comprising:
   forming a gate electrode on the silicate film, wherein the silicate film and the additional insulating film are used as a gate insulating film of a transistor.

8. The manufacturing method of the semiconductor device according to claim 1, wherein the silicate film contains hafnium as the metal.

9. The manufacturing method of the semiconductor device according to claim 1, wherein the silicate film contains zirconium as the metal.

10. A manufacturing method of a semiconductor device, comprising:
    forming a metal oxide film containing metal on a substrate; and
    introducing nitrogen and deuterium into the metal oxide film by using $ND_3$ gas so that the metal oxide film contains 10% or more nitrogen in an elemental composition ratio.

11. A manufacturing method of a semiconductor device, comprising:
    forming a silicate film containing metal on a substrate; and
    introducing nitrogen and deuterium into the silicate film by using $ND_3$ gas,
    wherein introducing the nitrogen and the deuterium into the silicate film comprises:
    forming a nitride film on the silicate film in an atmosphere containing a silicon source and the $ND_3$ gas; and
    heat-treating the silicate film and the nitride film.

* * * * *